(12) United States Patent
Pickles et al.

(10) Patent No.: US 6,390,857 B1
(45) Date of Patent: May 21, 2002

(54) ELECTRICAL CONNECTOR HAVING LEADING CAP FOR FACILITATING PRINTED CIRCUIT BOARD IN THE CONNECTOR INTO A MATING CONNECTOR

(75) Inventors: Charles Sands Pickles, York, PA (US); Chih-Ming Chien, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/746,088

(22) Filed: Dec. 21, 2000

(51) Int. Cl.⁷ .............................................. H01R 13/64
(52) U.S. Cl. ........................ 439/680; 439/79; 439/701
(58) Field of Search ................................. 439/680, 377, 439/55, 59, 636, 637, 61, 62, 64, 65, 67, 74, 77, 76.1, 608, 79, 701

(56) References Cited

U.S. PATENT DOCUMENTS 4,298,237 A * 11/1981 Griffith et al. ................ 439/60
6,171,115 B1 * 1/2001 Mickievicz et al. ........ 439/76.1

* cited by examiner

*Primary Examiner*—P. Austin Bradley
*Assistant Examiner*—Ross Gushi
(74) *Attorney, Agent, or Firm*—Wei Te Chung

(57) ABSTRACT

An electrical connector includes a front half (2), a back half (3) assembled to the front half, a plurality of circuit boards (4) and a plurality of leading caps (10). The front half has a front surface (23), an upper surface (20), and a lower surface (21). A top tongue (7) and a bottom tongue (8) extend respectively from the upper surface and the lower surface along a mating direction. The leading caps are positioned between the top tongue and the bottom tongue. The circuit boards are mounted in the combination of the front half and the back half and extend beyond the front surface. Each leading cap includes two inclined faces (13) facing forwardly for mating with a complementary connector (11). A swallow-tailed slot (14) is defined at a rear end of the leading cap to engage with a front edge of a corresponding circuit board.

18 Claims, 4 Drawing Sheets

ELECTRICAL CONNECTOR HAVING LEADING CAP FOR FACILITATING PRINTED CIRCUIT BOARD IN THE CONNECTOR INTO A MATING CONNECTOR

BACKGROUND OF THE INVENTION

1. Field of the Invention

The present invention relates to an electrical connector, and particularly to an electrical connector mounting printed circuit boards therein and having a plurality of leading caps for facilitating mating the printed circuit boards therein with a complementary connector.

2. Description of the Prior Art

Referring to FIG. 5, generally, when an electrical connector having a straddled contact arrangement connects with a printed circuit board (PCB hereinafter). One row of terminals 50 engages with an upper surface 53 of the PCB 52, and the other row engages with a lower surface 54 of the PCB 52. In order to facilitate mating with the PCB 52, each of the terminals 50 includes an arched section 55 at a free end thereof for mating with a corresponding golden finger 56 disposed on the upper surface 53 or the lower surface 54, and the PCB 52 defines two chamfers 57 on the upper surface 53 and the lower surface 54 thereof. However, the chamfers 57 are difficult to manufacture. Additionally, the material used for producing the PCB 52 is not durable enough to withstand many mating cycles. Therefore, the chamfers 57 of the PCB 52 can quickly become damaged in use. Hence, an improved leading cap is required to overcome the disadvantages of the prior art.

BRIEF SUMMARY OF THE INVENTION

The main object of the present invention is to provide an electrical connector having leading caps for facilitating mating of printed circuit boards therein with a corresponding complementary connector.

In order to achieve the above object, an electrical connector for mating with a complementary connector in accordance with the present invention comprises a front half, a back half assembled to the front half, a circuit boards and a leading cap. The front half has a front surface for mating with the complementary connector. The circuit board is mounted in the assembled front half and back half, and further extends beyond the front surface of the front half. A plurality of golden fingers is positioned adjacent to a front free end of the circuit board. The leading cap comprises two inclined faces and a swallow-tailed slot. The inclined faces face the complementary connector, while the swallow-tailed slot defined in a rear side of the leading cap engages with a front edge of the circuit board. The front half further defines an upper surface and a lower surface, and a top tongue and a bottom tongue forwardly extend from the upper and lower surface along the mating direction, respectively. The leading cap is positioned between the top tongue and the bottom tongue.

Other objects, advantages and novel features of the invention will become more apparent from the following detailed description of the present embodiment when taken in conjunction with the accompanying drawings.

DESCRIPTION OF THE PREFERRED EMBODIMENT

Figure 1:
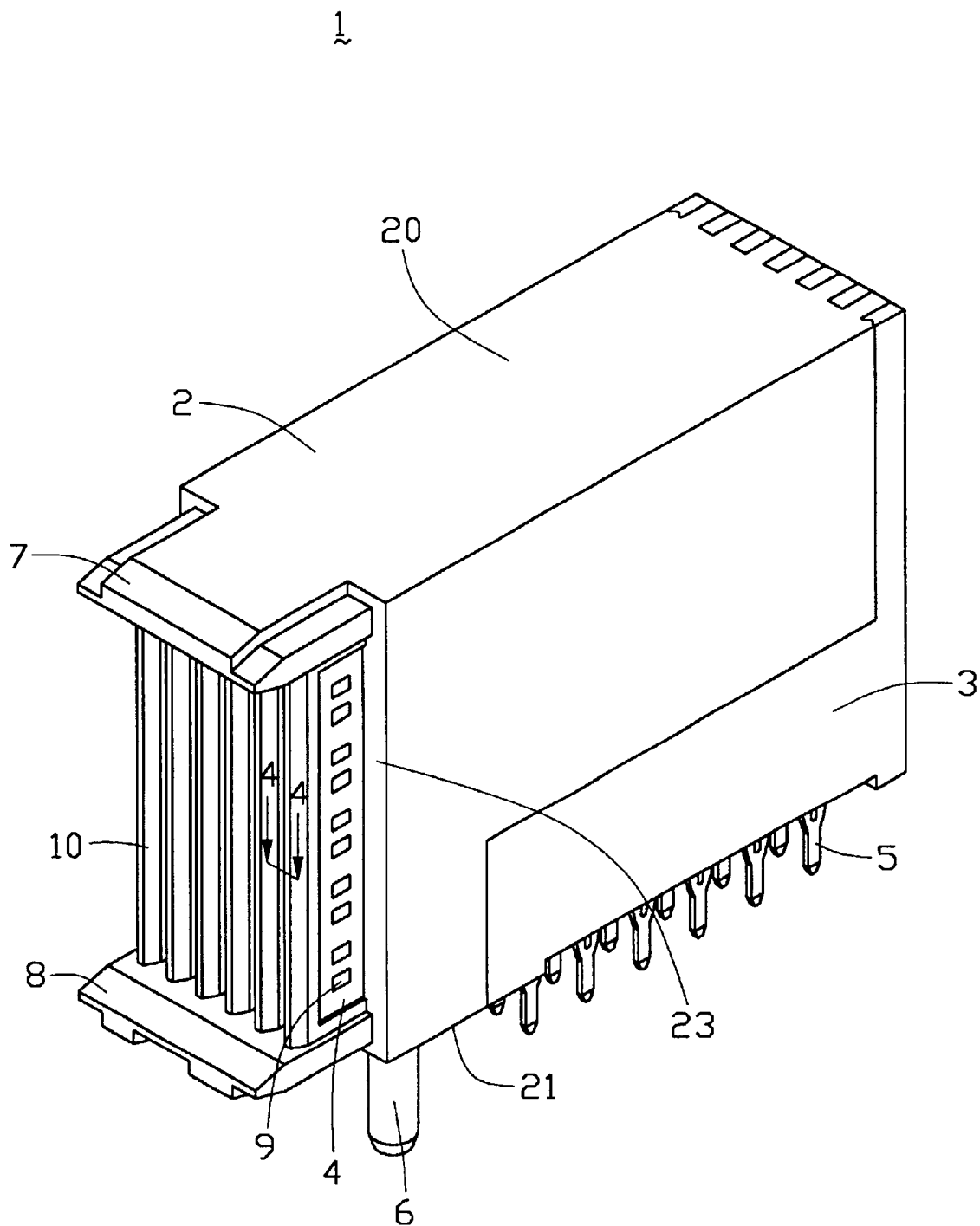
FIG. 1 is a perspective view of an electrical connector in accordance with the present invention.
Figure 2:
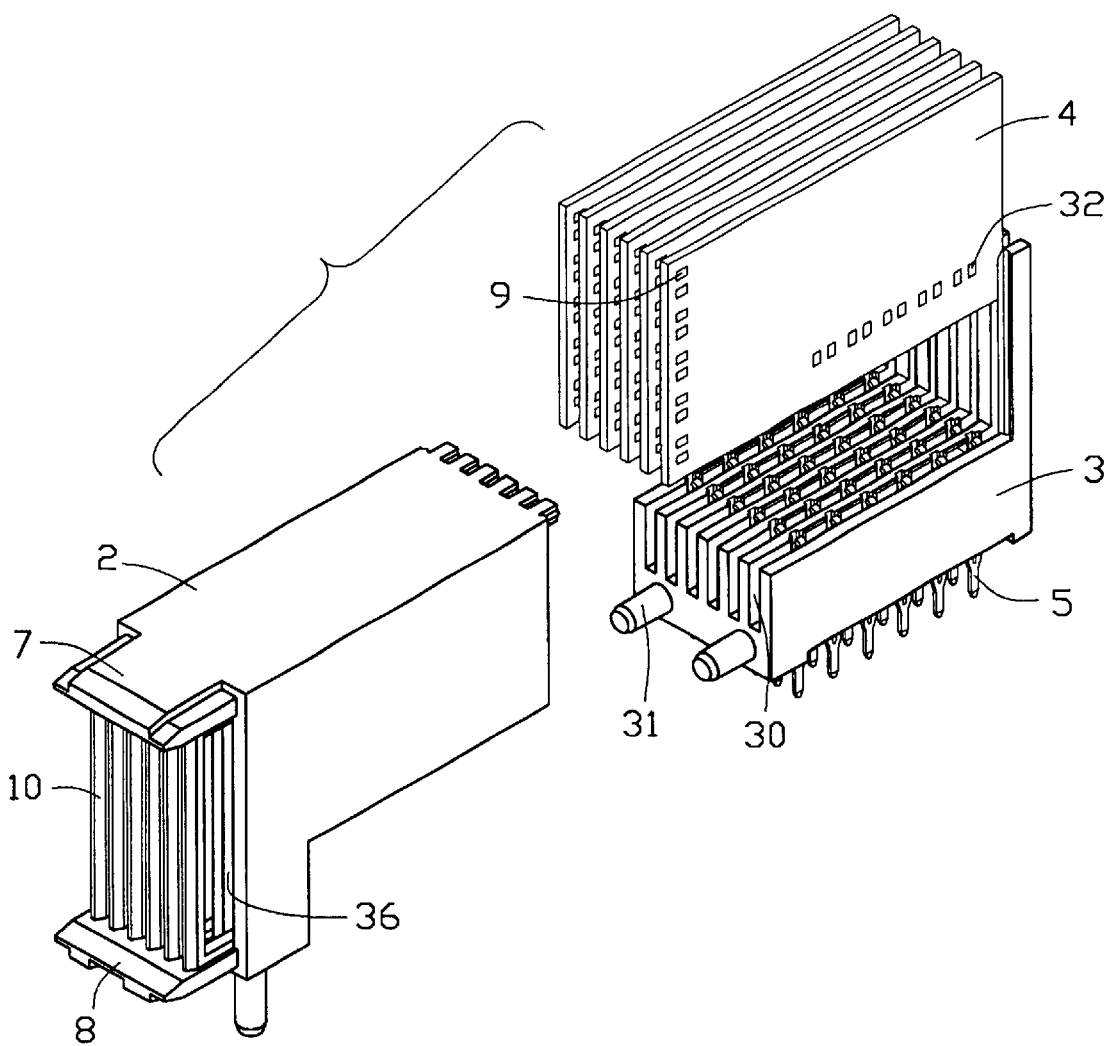
FIG. 2 is an explored view of the electrical connector as shown in FIG. 1.

Referring to FIGS. 1 and 2, an electrical connector 1 in accordance with the present invention comprises a front half 2, a back half 3 and a plurality of circuit boards 4 assembled in the combination of the front half 2 and the back half 3. The front half 2 and the back half 3 together form a housing of the connector 1. Furthermore, a plurality of grounding terminals 5 and signal terminals (not shown) are positioned in the back half 3, and downwardly extend from the back half 3. The back half 3 defines a plurality of grooves 30 therein. A pair of engaging studs 31 extends forwardly from the back half 3.

Figure 4:
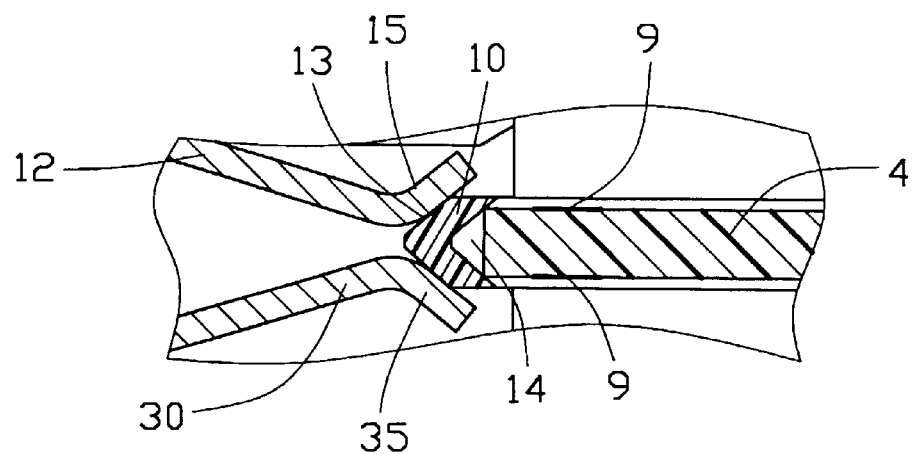
FIG. 4 is a partial, cross-sectional view of the electrical connector with the complementary connector taken along line 4—4 of FIG. 1.
Figure 5:
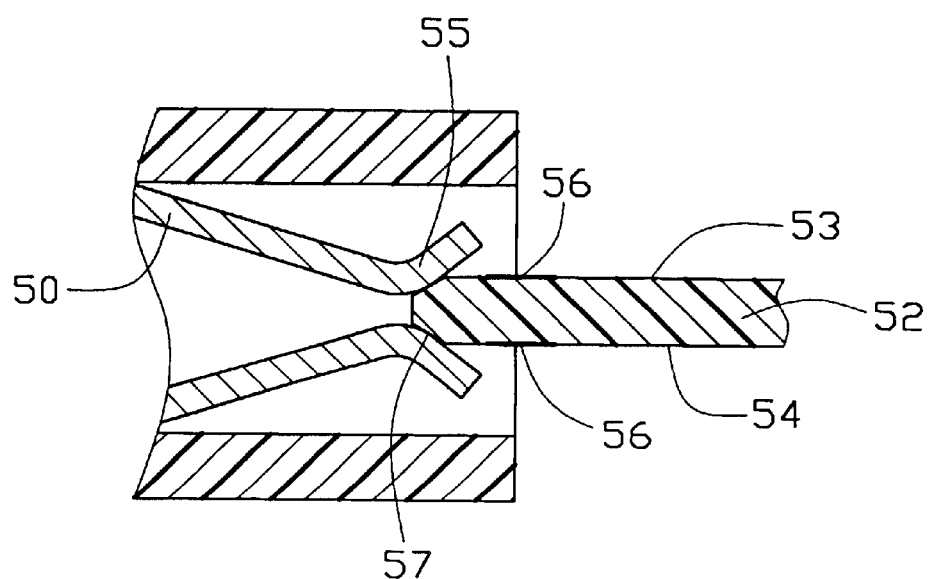
FIG. 5 is a partial, cross-sectional view of a conventional electrical connector in prior art mating with a PCB.

The front half 2 defines a front surface 23, an upper surface 20 and a lower surface 21. A pair of posts 6 (only one visible in FIG. 1) downwardly extends from the lower surface 21 of the front half 2 to locate the electrical connector 1 on a printed circuit board shown with the dotted lines. A top tongue 7 and a bottom tongue 8 forwardly extend from the upper surface 20 and the lower surface 21, respectively. A plurality of leading caps 10 are formed between the top tongue 7 and the bottom tongue 8. In the front half 2, there is a plurality of passageways 36. Referring to FIG. 4, two inclined faces 13 are defined at a front end of each leading cap 10. A swallow-tailed slot 14 is defined at an opposite rear end.

Each circuit board 4 is mounted in the passageway 36 of the front half 2 and the groove 30 of the back half 3, and further extends beyond the front surface 23 of the front half 2 and is ended by the leading cap 10. At one face, a row of first golden fingers 9 is disposed along a front edge of the circuit boards 4, and another row of second golden fingers 32 is disposed vertical to the first golden fingers 9, while at another face, there defines two rows of grounding golden fingers which are similar to the first golden fingers 9 and the second golden fingers 32. Then the grounding terminals 5 engage with the grounding fingers of the circuit boards 4 to establish an electrical connection between the circuit boards 4 and the mated printed circuit board.

In assembly, the circuit boards 4 are received in the combination of the passageways 36 and the grooves 30, and the front half 2 and the back half 3 are assembled together by the pair of engaging studs 31 engaging with corresponding holes (not shown) defined in the front half 2. Each leading cap 10 is positioned at a front edge of a corresponding circuit board 4. When the circuit boards 4 are assembled in the front half 2 and the back half 3, the swallow-tailed slots 14 each engage with the front edge of a corresponding circuit board 4, while the two inclined faces 13 face the mating direction.

Figure 3:
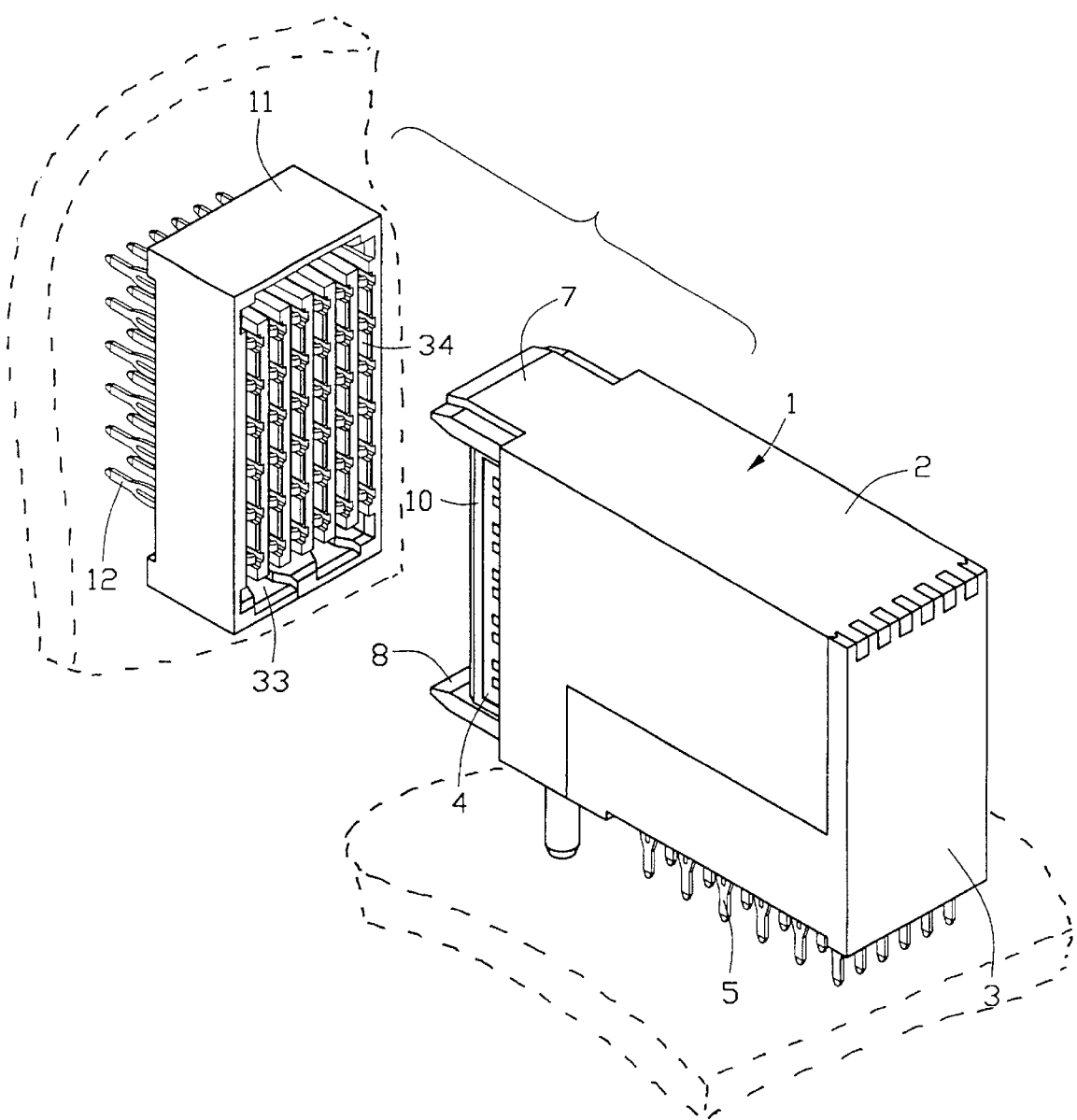
FIG. 3 is perspective view of the electrical connector of FIG. 1 from a rear aspect, and a complementary connector to be mated with the electrical connector.

Referring to FIG. 3, a complementary connector 11 which may be located on another printed circuit board shown with the dotted lines, defines a pair of slots 33 at opposite ends thereof, and a plurality of grooves 34 therein. A plurality of grounding contacts 12 and signal contacts 30 (see FIG. 4) are received in the grooves 34. Each of the grounding contacts 12 and the signal contacts 30 comprises an engaging section 15, 35 at a free end thereof.

FIG. 4 shows the protective function of the leading cap 10 when the electrical connector 1 mates with a complementary connector 11. When mating, the top tongue 7 and the bottom tongue 8 are inserted into the slots 33 of the complementary connector 11, the grounding contacts 12 and the signal contacts 30 engage with corresponding golden fingers of the circuit boards 4. In the process of engagement, the engaging sections 15, 35 of the grounding contacts 12 and the signal contacts 30 slide over the inclined faces 13 to engage with corresponding golden fingers 9 of the circuit board 4.

Since, the leading caps 10 are made of a durable plastic material, the durability of the electrical connector 1 and the circuit boards 4 is increased. Furthermore, the leading caps 10 are easily to manufacture since they are an integral part of the front half 2 which is made by plastics injection molding.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for mating with a complementary connector, comprising:
   a housing having a front surface for mating with the complementary connector;
   a circuit board mounted in the housing and further extending beyond the front surface of the housing, and having a plurality of golden fingers adjacent to a front end of the circuit board; and
   a leading cap integrally formed with the housing for protecting the front end of the circuit board during mating with the complementary connector, the leading cap comprising:
      an inclined face at a front side of the leading cap; and
      a positioning section at a rear side of the leading cap for positioning the leading cap on the front end of the circuit board.

2. The electrical connector as claimed in claim 1, wherein the leading cap has two inclined faces, and the positioning section is substantially a swallow-tailed slot defined in a rear side of the leading cap.

3. The electrical connector as claimed in claim 1, wherein an upper surface and a lower surface are defined on the housing, and a top tongue and a bottom tongue extend forward from the upper surface and the lower surface, respectively.

4. The electrical connector as claimed in claim 3, wherein the leading cap is formed between the top tongue and the bottom tongue.

5. The electrical connector as claimed in claim 1, wherein a plurality of terminals is received in the housing for connecting the circuit board with a mated printed circuit board.

6. An electrical connector having a mating face and a circuit board received therein, the circuit board extending beyond the mating face to engage with a corresponding connector, the connector having a leading cap integrally formed thereon and attached to the circuit board for protecting a front end of the circuit board during mating with a corresponding complementary connector, wherein the leading cap comprises a guiding section at a front side thereof and a positioning section at a rear side thereof attached to a mating edge of the circuit board.

7. The electrical connector as claimed in claim 6, wherein the electrical connector comprises a front half and a back half, the circuit board being mounted in the front half and the back half, and the leading cap being integrally formed with the front half.

8. The electrical connector as claimed in claim 6, wherein the guiding section has two inclined faces for guiding.

9. An electrical connector assembly comprising:
   a first connector having a plurality of contacts and a groove therein; and
   a second connector having a front half, a back half and a circuit board therein, the circuit board being received in a receiving space defined by a passageway of the front half and a groove of the back half, an end of the circuit board extending outside of the front half and being ended by a leading cap integrally formed with the front half for engaging with the first connector, and the other opposite end of the circuit board connecting with a plurality of terminals therein;
   wherein when mating, the end of the circuit board is received in the groove of the first connector to establish a circuit connection between the contacts of the first connector and the terminals of the second connector.

10. The electrical connector assembly as claimed in claim 9, wherein the leading cap has two inclined faces, and a swallow-tailed slot defined in a rear side of the leading cap.

11. The electrical connector assembly as claimed in claim 9, wherein an upper surface and a lower surface are defined on the front half, and a top tongue and a bottom tongue extend forward from the upper surface and the lower surface, respectively.

12. The electrical connector assembly as claimed in claim 11, wherein the leading cap is formed between the top tongue and the bottom tongue.

13. An electrical assembly comprising:
   a first main printed circuit board;
   a first connector mounted on said first main printed circuit board and having a plurality of leading caps integrally formed therewith;
   a second main printed circuit board;
   a second connector mounted on said second main printed circuit board; and
   a plurality of circuit boards connected between said first connector and said second connector; wherein
   said first main printed circuit board, said second main printed circuit board, and said plural circuit boards are mutually perpendicular with one another;
   wherein said plural circuit boards are embedded within the first connector and each has a front edge protected by a corresponding leading cap and exposed to an exterior for being engaged within the second connector.

14. An electrical connector comprising:
   a housing including a front half and a back half;
   said back half having a plurality of parallel spaced grooves and a plurality of terminals disposed in the grooves;
   said front half defining a plurality of parallel spaced passageways in alignment with the corresponding grooves, respectively; and
   a plurality of circuit boards embedded within the housing and each retained between the corresponding groove and the corresponding passageway; wherein
   one edge of each of said circuit boards removably and electrically engages with the terminals located in the corresponding groove, and another edge of each of said circuit boards is exposed to an exterior for mating within a card edge receiving groove of another connector.

15. The connector as claimed in claim 14, wherein said two edges are perpendicular to each other.

16. The connector as claimed in claim 14, wherein at least one of said front half and said back half has an L-shaped cross-section.

17. An interconnection system comprising:
- a connector defining a card edge receiving groove;
- a plurality of terminals located in said groove;
- a circuit board having gold fingers on one edge section thereof; and
- a housing defining a passageway receiving said edge section of the circuit board therein, and a leading cap integrally formed therewith and extending along a lengthwise direction of and in alignment with said passageway; wherein
- said cap is configured to be protectively positioned in front of the edge section of the circuit board and is inserted into the groove together with insertion of said circuit board into the groove whereby the terminals will be guidably engaged with the corresponding gold fingers by said cap without damage to either the terminals or the circuit board which is protectively hidden behind said cap.

18. An electrical connector assembly comprising:
- a first connector having a plurality of contacts and a groove therein; and
- a second connector having a front half, a back half and a circuit board therein, the circuit board being received in a receiving space defined by a passageway of the front half and a groove of the back half, an end of the circuit board extending outside of the front half and being ended by a leading cap for engaging with the first connector, and the other opposite end of the circuit board connecting with a plurality of terminals therein;
- wherein when mating, the end of the circuit board is received in the groove of the first connector to establish a circuit connection between the contacts of the first connector and the terminals of the second connector; wherein
- the leading cap has two inclined faces, and a swallow-tailed slot is defined in a rear side of the leading cap.

* * * * *